United States Patent [19]

Track

[11] Patent Number: 4,852,068

[45] Date of Patent: Jul. 25, 1989

[54] SEISMIC SIGNAL VELOCITY FILTERING

[75] Inventor: Antoine Track, Ris-Orangis, France

[73] Assignee: Schlumberger Technology Corporation, New York, N.Y.

[21] Appl. No.: 191,282

[22] Filed: May 6, 1988

[30] Foreign Application Priority Data

May 6, 1987 [FR] France ................................ 87 06330

[51] Int. Cl.$^4$ .......................... G01V 1/40; G01V 1/28
[52] U.S. Cl. ......................................... 367/57; 367/43; 364/421; 364/422
[58] Field of Search ....................... 367/43, 44, 57, 74; 381/47, 45; 364/421, 422, 726, 827

[56] References Cited

U.S. PATENT DOCUMENTS

| 4,218,765 | 8/1980 | Kinkade | 367/45 |
| 4,397,004 | 8/1983 | Bronislaw | 367/43 |
| 4,527,260 | 7/1985 | Horowicz | 367/47 |
| 4,608,673 | 8/1986 | Lazear | 367/43 |
| 4,627,036 | 12/1986 | Wyatt | 367/57 |
| 4,706,225 | 11/1987 | Raoult | 367/57 |
| 4,794,573 | 12/1988 | Bell et al. | 364/422 |

FOREIGN PATENT DOCUMENTS 0053525 6/1982 France .
2030410 4/1980 United Kingdom .

OTHER PUBLICATIONS

Mammo, T.; "Wavefield Separation Methods in VSP . . . "; Boll Geofis Teorica Appl., vol. 29, #116, pp. 275-307, 12/87, Abst.
Williams, S. R.; "Fourier Efficiency Using . . . Hilbert Samples"; J. Acoust. Soc. Am., vol. 67, #2, pp. 581-588, 2/80, Abst.
Hu et al.; "Wavefield Transformations of VSP", Geophysics, vol. 52 #3, pp. 307-321, 3/87, Abst.
H. Schussler, et al., "A Simple Method for the Design of Velocity Filters with Choosable Discrimation", Archiv Fur Elektronik Und Ubertragungstechnik, vol. 40, No. 6, Nov.-Dec. 1986, pp. 342-348.
D. McCowan et al., "Fan Filters for Data with Variable Spatial Sampling", IEEE Trans. on Acoustics, Speech, and Signal Processing, vol. ASSP-32, No. 6, Dec. 1984, pp. 1154-1159.

Primary Examiner—Nelson Moskowitz
Attorney, Agent, or Firm—Clifford L. Tager; Keith G. W. Smith

[57] ABSTRACT

A method of velocity filtering seismic signals and an installation for implementing the method. A two-dimensional signal g(z,t) is available built up from a set of signals $g_i(t)$ for $I > i > n$ as produced by sound wave detectors located at different depths $z_1, \ldots z_n$ in a borehole in response to sound waves being emitted from a source as seismic waves, with said detected signals including upgoing waves and downgoing waves. In order to reinforce the upgoing waves (or conversely the downgoing waves) in the signal g(z,t), an operator A is applied recursively to said signal, where: $A = \frac{1}{2}[Id + \epsilon.B.H_t.D_z]$ where: Id is the identity operator; $\epsilon = +1 (\text{or} -1)$; B is normalization factor whose value depends on the signal g(z,t) to which the operator A is applied; $H_t$ is the one-dimensional Hilbert operator relating to the variable t; and $D_z$ is a differentiation operator relating to the variable z.

14 Claims, 11 Drawing Sheets

SEISMIC SIGNAL VELOCITY FILTERING

BACKGROUND OF THE INVENTION

1. Technical Field

The present invention is directed to filtering. More particularly, the present invention is directed to a method of velocity filtering seismic signals.

2. Background Information

One technique known in the art for studying underground formations is the "Vertical Seismic Profile" technique, in which a seismic wave detector is placed in a borehole successively at different depths, with seismic waves being emitted from a source on the surface and with the signals produced by the detector being recorded by the seismic wave detector located downhole.

The essential purpose of these measurements is to determine the reflective horizons or reflectors which are situated deeper than the bottom of the borehole by analyzing the waves reflected on these reflectors and rising towards the detector. These waves are commonly referred to in the art as "upgoing" waves.

The detected waves comprise not only the upgoing waves, but also waves known as "downgoing" waves, which include waves that have propagated directly from the source to the detector, waves which have been subjected to multiple reflections, and interfering waves of various kinds.

By putting together all of the recorded signals in a single document, it is possible to detect coherencies between the various traces. However, given the multiplicity of superposed components in each signal, such a document is extremely difficult to interpret.

In order to detect reflectors and their positions, it is therefore desirable to filter the recorded signals in order to analyze the upgoing waves.

One prior art filter method for reinforcing a given wave component in a set of signals recorded at levels $z_i$ (where i lies between 1 and n) is described in French patent document FR-A-2 494 450, herein incorporated by reference. This filtering consists in advancing the m ($m<n$) first signals $g_i(t)$ recorded at levels $z_i$ by a time $t_i$ where $2<i<m$ relative to the signal $g_1(t)$ recorded at level $z_1$ in order to align the downgoing wave components and produce a first signal by adding together the signals shifted in this way. Similarly, a second signal is produced by adding together recorded signals $g_i(t)$ for $1<i<m$ after delaying the signals $g_i(t)$ for $2<i<m$ by a time $t_i$ relative to the signal $g_1(t)$. The first and second signals are then combined in order to produce a signal $u_1^*$ representative of an optimum estimation of the upgoing wave component. Signals $u_2^*, \ldots, u_k^*$ are produced in the same manner from set of m recorded signals $\{g_2(t), \ldots, g_{m+1}(t)\}, \ldots, \{g_k(t), \ldots, g_{m+k-1}(t)\}$, ....

This method suffers from the drawback of reinforcing, in practice, only those waves which are aligned in the recorded signals after they have been shifted, whereas waves having different velocities simply do not show up.

Another prior art filter technique is the F-K velocity filter method which serves to separate upgoing waves from downgoing waves. This method is described in the article entitled "Vertical Seismic Profiling" by B. A. Hardage, Geophysical Press, 1983, pp. 175-179, herein incorporated by reference.

In the F-K velocity filter method, the set of signals $g_i(t)$ recorded by the detector at depths $z_i$ for $1<i<n$ is taken to be a two dimensional signal g(z,t) and the following successive operations are performed:

(a) the two-dimensional Fourier transform G(k,w) of the signal g(z,t) is calculated where k and w are the dual variables of z and t respectively, in the Fourier transform. The signal G(k,w) has the advantage that the upgoing waves are to be found in the quadrant $k>0$, $w>0$ and the downgoing waves are in the quadrant $k<0$, $w>0$;

(b) the coefficients contained in the quadrant $k<0$, $w>0$ are set to zero or are multiplied by a small factor, e.g. $10^{-3}$; and (c) the inverse two-dimensional Fourier transform is calculated and in the resulting signal $g_u(z,t)$ the downgoing waves are highly attenuated.

This method suffers from problems due to side-effects because of the sharp cut-off between those coefficients which are modified in operation (b) and the other coefficients which are not modified. In particular, this gives rise to artifacts and to spectrum folding during operation (c).

Further, the Fourier transform using each of the variables z and t requires a certain number of samples to be available. This is no problem for the variable t since there are generally several thousand points available along the t-axis, given that each signal is recorded over a period of several seconds and that the sampling period is about 1 ms. In contrast, the number of points available along the z-axis depends on the number of levels at which signals are recorded, and this is typically much less.

In order to perform the Fourier transform of the variable z, it is necessary to have at least 64 different recording levels, with the gap between consecutive levels being no greater than a value related to the highest frequency in the received signal and to the lowest propagation velocity, with a typical value being about 10 meters (m). Such a procedure is too expensive.

Another prior art velocity filter is the Tau-P method. This method is equivalent to the F-K method but has the advantage of being suitable for implementation with a smaller number of signals, thereby reducing measurement costs. However, this method suffers from the same defects of artifacts and spectrum folding as the F-K method.

SUMMARY OF THE INVENTION

Accordingly, an object of the present invention is to eliminate the defects of artifacts and of spectrum folding which appear, in particular, in the above-mentioned prior methods.

A further object of the present invention is to enable velocity filtering using a relatively small number of recorded signals, thereby reducing the cost of on-site measuring and simplifying the processing performed on the signals.

The present invention provides a method of seismic exploration by filtering a two-dimensional signal g(z,t) built up from a set of signals $g_i(t)$ for $1<i<n$ as produced by at least one seismic wave detector placed at different depths $z_1, \ldots, z_i, \ldots, z_n$ in a borehole, each of the signals being produced in response to seismic waves being emitted and including upgoing wave components and downgoing wave components. The filtering includes separating the upgoing and downgoing wave components. The filtering method applies an operator A to the two-dimensional signal g(z,t), wherein:

$$A = \tfrac{1}{2}[Id + \epsilon.B.H_t.D_z]$$

in which:
Id is the identity operator;
B is a normalization factor whose value depends on the signal to which the operator A is applied;
$H_t$ is the one-dimensional Hilbert operator with respect to the variable t;
D is a differentiation operator with respect to the variable z; and
$\epsilon$ is an integer equal to +1 or −1;
the operator being applied recursively to the two-dimensional signal g(z,t), with the resulting signal being predominantly constituted by upgoing waves when $=\epsilon+1$ and by downgoing waves when $\epsilon=-1$.

The normalization factor B may be defined, for a function g, as follows:

$$\sqrt{||H_t \cdot D_z(g)|| \cdot B} = \sqrt{||g||}$$

where $||\ ||$ indicates the L2 norm of the function.

It will thus be understood that when the operator A is applied recursively to a signal, the normalization factor B must be recalculated for each iteration as a function of the signal to which the operator A is applied.

The Hilbert operator $H_t$ may be defined as follows:

$$H_t(g(t)) = FT^{-1}[j.sgn(\omega).FT(g(t))]$$

where:
g(t) is a function of the variable t;
$FT^{-1}$ is the inverse Fourier transform;
j is the complex operator such that $j^2 = -1$;
sgn is the sign function which is equal to +1 or −1 or 0 depending on whether a variable is positive, negative, or zero;
$\omega$ is the dual variable of the variable t; and
FT represents the Fourier transform.

Thus, the method in accordance with the invention uses the Fourier transform for the variable t for which the number of samples available is commonly several thousand, while the differentiation operator $D_z$ applied to the variable z does not require a large number of recordings $z_i$ to be available.

The differentiation operator $D_z$ applied to a signal g(z) is defined by:

$$D_z[g(z)] = \sum_{m=1}^{I} \frac{g(z+2m-1) - g(z-2m+1)}{2m-1}$$

where I is a parameter whose value may for instance be 1 or 2.

The method in accordance with the present invention can also be used to perform so-called "fan" filtering so as to retain only those waves having velocities lying between two predetermined velocities $Vc_1$ and $Vc_2$. This is preferably done as follows: the recorded signals $g_i(t)$, $2 < i < n$ constituting the two-dimensional signal g(z,t) are shifted in time relative to one another so that the components of waves of velocity $Vc_1$ appear at the same instant in each signal. The shifted two-dimensional signal is then filtered in accordance with the present invention and the resulting signal is time shifted to cancel the initial shift. The same operation is performed for the two-dimensional signal g(z,t) for the velocity $Vc_2$ in order to produce a second two-dimensional signal. The difference between the two two-dimensional signals is then taken in order to produce a two-dimensional signal comprising only those waves whose velocities lie between $Vc_1$ and $Vc_2$.

DESCRIPTION OF PREFERRED EMBODIMENT

Figure 1:
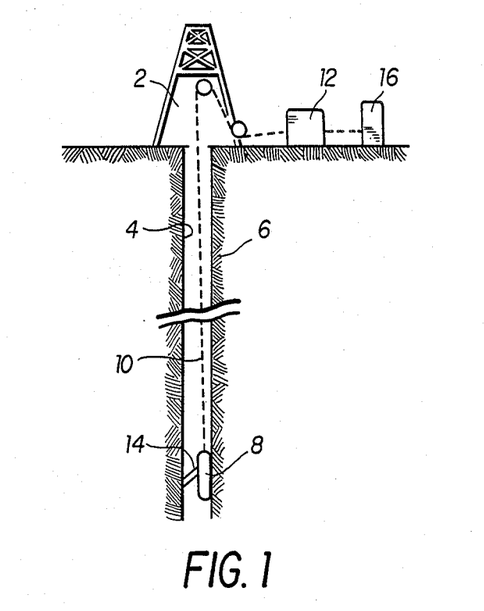
FIG. 1 is a diagram of an installation for seismic exploration suitable for obtaining a vertical seismic profile.

FIG. 1 shows an installation for seismic exploration comprising drilling derrick 2 disposed over borehole 4 drilled in ground formations 6.

Downhole apparatus 8 including a seismic wave sensor such as a geophone is suspended down borehole 4 by means of electric cable 10 which passes over sheaves mounted on the drilling derrick. Cable 10 is used for displacing apparatus 8 within the borehole and simultaneously serves to transmit the detection signals produced by the sensor towards surface equipment 12. In conventional manner, surface equipment 12 comprises a winch for winding the cable and means for determining the depth at which downhole apparatus 8 is located, together with means for processing and recording the detection signals transmitted via cable 10.

Downhole apparatus 8 may be conventionally constituted by moving anchor member 14 capable of anchoring in the wall in order to ensure appropriate contact between the sensor and the wall of the borehole. This takes place only when apparatus 8 has arrived at a depth at which a measurement is to be performed, with surface equipment 12 then transmitting a message in order to cause element 14 to move into the anchoring position.

A source of seismic waves 16 is located on the surface at a given distance from the head of the borehole. This source may be constituted by any suitable device such as an air gun. Source 16 is controlled from surface equipment 12 in order to fire a shot when downhole apparatus 14 is anchored at one of the specified depths.

Several shots are generally fired for each depth, and all of the signals produced in this way are stored and added together in surface equipment 12 so as to obtain a signal for each level in which the significant components are reinforced to the detriment of random noise components. This signal is referred hereinafter as the detection signal.

The set of detection signals $g_i(t)$ obtained at the various levels $z_i$ for $1 < i < n$ is used to produce graphic recordings (known as seismic traces) which are put together in a single document called the vertical seismic profile.

Figure 2:
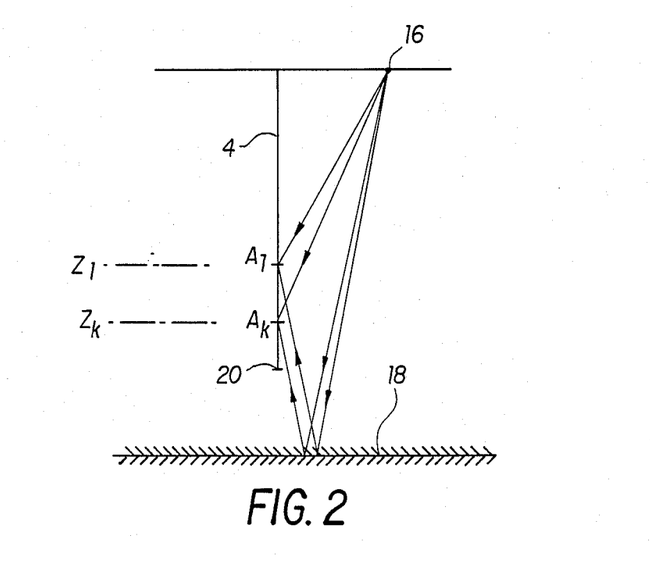
FIG. 2 shows in highly simplified manner the paths of upgoing and downgoing seismic waves relating to two different positions of the detector.

FIG. 2 shows highly simplified versions of the paths of the sound waves detected by the sensor at two different levels. Reference 18 designates a reflecting horizon or "reflector" which is deeper than bottom 20 of the borehole. Reflector 18 is constituted by the interface between two layers of significantly different acoustic impedances.

The sensor placed at $A_1$ at level $z_1$ receives a sound wave coming directly from the source and called the downgoing wave, and also receives a wave reflected by reflector 18, and called the upgoing wave. The upgoing wave needs to be shown up in order to be able to determine the depth of the reflector and also its reflection coefficient.

The detection signal $g_1(t)$ obtained at level $z_1$ is thus the sum of a downgoing wave component and an upgoing wave component, and in addition it includes noise components, some of which come from multiple reflections on reflectors situated between the surface and the bottom of the borehole.

The sensor placed at $A_k$ at level $z_k$ similarly receives a downgoing wave and an upgoing wave, however the downgoing wave arrives later and the upgoing wave arrives sooner.

The method of the invention consists in processing the two-dimensional signal $g(z,t)$ in order to isolate either the upgoing waves or the downgoing waves.

The invention lies firstly in the definition of two functions $g_u$ and $g_d$ which correspond, respectively, to the upgoing and the downgoing waves, and secondly in the use of approximate expressions for these functions in order to provide a velocity filter.

We begin by showing the functions:

$$g_u = \tfrac{1}{2}[g + H2(g)] \text{ and}$$

$$g_d = \tfrac{1}{2}[g - H2(g)]$$

where H2 is the two-dimensional Hilbert transform, respectively, containing the upgoing waves and the downgoing waves of the recorded signal $g(z,t)$.

This is achieved by using the known properties of the Fourier transform. It is known that in the F-K transform domain, the upgoing waves lie in the quadrants for which the variables $\omega$ and $k$ have opposite signs, whereas the downgoing waves lie in the quadrants for which the variables $\omega$ and $k$ have the same sign.

Figure 3:
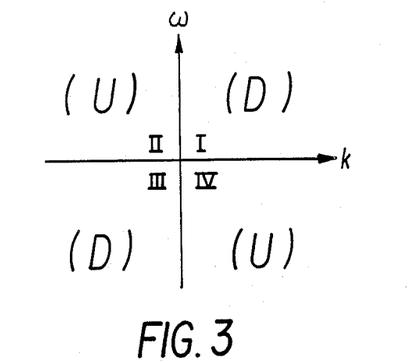
FIG. 3 shows the positions of the upgoing waves U and the downgoing waves D in the $\omega$-k plot of the F-K transform domain.

As shown in FIG. 3, the upgoing waves U lie in quadrants II and IV, and the downgoing waves D lie in quadrants I and III.

Using the definitions of the Fourier and of the Hilbert transforms, the following equation can be deduced:

$$FT[H(f)](\omega) = j.sgn(\omega).FT[f](\omega) \tag{1}$$

where:
FT and H are the one-dimensional Fourier and Hilbert transforms, respectively;
f is a function;
j is the complex operator such that $j^2 = -1$; and
sgn is the sign function which is defined by $$sgn(\omega) = +1 \text{ if } \omega > 0$$

$$sgn(\omega) = -1 \text{ if } \omega < 0$$

$$sgn(\omega) = 0 \text{ if } \omega = 0.$$

The following equation is derived from equation (1):

$$FT2[H2(g)](\omega,k) = -sgn(\omega,k).FT2[g](\omega,k)$$

where
FT2 and H2 are the two-dimensional Fourier and Hilbert transforms respectively.

$FT2[g_u](\omega,k)$ can be expressed in the following form:

$$FT2[g_u](\omega,k) = \tfrac{1}{2}(FT2[g](\omega,k) + FT2[H2(g)](\omega,k))$$

whence:

$$FT2[g_u](\omega, k) = \frac{1 - sgn(\omega, k)}{2} \cdot FT2[g](\omega, k)$$

The coefficient $(1 - sgn(\omega,k))/2$ is equal to 1 in quadrants II and IV and is equal to 0 in quadrants I and III of the FIG. 3 plot, thus showing that the function $g_u$ contains only upgoing waves only.

It can be shown that $$FT2[g_u](\omega, k) = \frac{1 + sgn(\omega, k)}{2} \cdot FT2[g](\omega, k)$$

which means that the function $g_d$ is equal to the signal g in quadrants I and III, and is equal to 0 in quadrants II and IV, i.e. that the function $g_d$ contains downgoing waves only.

Velocity filtering in accordance with the present invention thus consists in applying the operator R, equal to $\tfrac{1}{2}.[Id + \epsilon H2]$, to the recorded signal $g(z,t)$, with Id being the identity operator and $\epsilon = -1$ or $+1$ depending on whether the upgoing waves or the downgoing waves are to be obtained.

The two-dimensional Hilbert transform H2 comprises a transform $H_t$ with respect to the variable t and a transform $H_z$ with respect to the variable z. In order to apply these transforms directly, it is necessary for the number of samples in the signal along the variable in question to be large, for example, preferably not less than 100.

There is no problem for the $H_t$ transform since several thousand points are generally available along the t-axis.

In contrast, the number of points along the z-axis, i.e. the number of recorded signals $g_i(t)$ with $1 < i < n$, is limited for reasons of cost. The operator $H_z$ is typically therefore not applied directly.

In accordance with the present invention, the operator $H_z$ is replaced by a differentiation operator $D_z$, i.e. an operator operating on a limited number of points along the z-axis and which constitutes an approximation to the operator $H_z$, and the operator R modified in this way is applied recursively.

More precisely, the operator R equal to $$\tfrac{1}{2}[Id + \epsilon H_t H_z]$$

is replaced by the operator A which is equal to $$\tfrac{1}{2}[Id + \epsilon B.H_t.D_z]$$

where B is a normalization coefficient whose value depends on the signal g to which the operator A is applied in such a manner that the norm of the signal A[g] is equal to the norm of the signal g.

Particular implementations of the operators $H_t$ and $D_z$ are now described.

The Hilbert transform $H_t$ may be implemented by any of the methods known in the art. In particular, the conventional formulation of the Hilbert transform using a convolution may be used:

$$H_t(g) = g.CONV.(1/t)$$

However, it is preferable to use the following equation deduced from equation (1):

$$H_t(g) = IFT_t[j.sign(\omega).FT_t(g)]$$

where $IFT_t$ is the inverse Fourier transform.

In this equation, the Hilbert transform of the function g is obtained by calculating the Fourier transform of the function g, multiplying the result by $j.sgn(\omega)$, and calculating the inverse transform. This method has the advantages of being very fast and of providing a very accurate result. As for the operator $D_z$, it is advantageous to use an expression of the following form:

$$D_z[g(z)] = \sum_{m=1}^{I} \frac{g(z + 2m - 1) - g(z - 2m + 1)}{2m - 1}$$

where I is an integer whose value is preferably not more than a few units. For I=1, D constitutes a three-level filter and for I=2 it constitutes a seven-level filter.

It has been observed experimentally that filtering is already very effective for I=1.

In this particular case, the filter process of the present invention may be explained, from a theoretical point of view, as follows.

From equation (1) it can be deduced that the Hilbert transform $H_t$ has $j.sgn(\omega)$ as its transfer function. Similarly, $H_z$ has $j.sgn(k)$ as its transfer function. From this it can be deduced that the operator R has a transfer function T(R) equal to:

$$(1 - sgn(\omega.k))/2.$$

In the operator A, $H_z$ is replaced by $D_z$. When I=1, it is shown that $D_z$ has $j.sin(k)$ as its transfer function. The transfer function T(A) of the operator A is thus:

$$T(A) = \frac{1 - sgn(\omega) \cdot sin(k)}{2}$$

Figure 4:
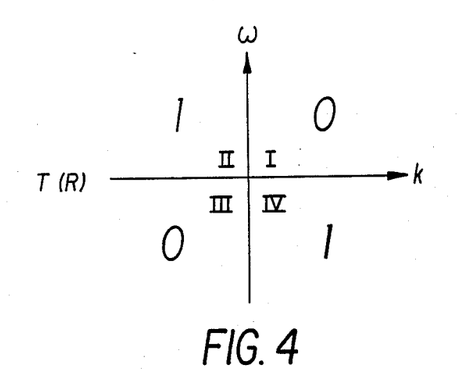
FIG. 4 is a diagram of the transfer function of the operator R in the $\omega$-k plot of the F-K transform domain.
Figure 5:
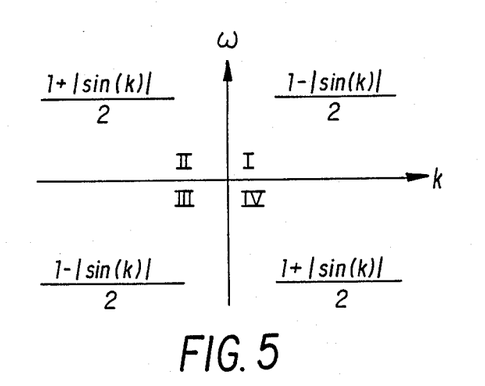
FIG. 5 is a diagram of the transfer function of the operator A in the $\omega$-k plot of the F-K transform domain.

FIGS. 4 and 5 are diagrams of the transfer functions T(R) and T(A) in the $\omega$-k plot of the F-K transform domain. The coefficients shown in the quadrants are the multiplicative coefficients applied to each signal sample in the quadrant.

In FIG. 4, the value of the multiplicative coefficient switches abruptly from one value to another when moving from one of the quadrants into an adjacent quadrant. As mentioned above, this gives rise to defects in the filtered signal, and in particular it gives rise to spectrum folding.

In contrast, it can be seen that the value of the multiplicative coefficients shown in FIG. 5 changes continuously on moving from one quadrant to another. This explaines why a signal filtered in accordance with the method of the present invention does not suffer from spectrum folding.

It is also recalled that in accordance with the present invention the operator A is applied recursively to the recorded signal g(z,t). Thus, in fact, it is the opertor $A^p$ for integer p that is applied, and the multiplicative coefficients are the coefficients shown in FIG. 5 raised to the power p. It is clear that $A^p$ gets closer to R for increasing p.

It has been experimentally observed that, for upgoing waves, the filtered signal is usable with p=1, and become very good with p=2. As for downgoing waves, the filtered signal is good with p=1 since the signal/noise ratio for those waves is higher than for upgoing waves.

When filtering to show up the upgoing waves, it is possible to apply bandpass filtering over the band 2 through 50 Hz after each application of the operator A in order to remove residual high frequency downgoing waves.

Figure 6:
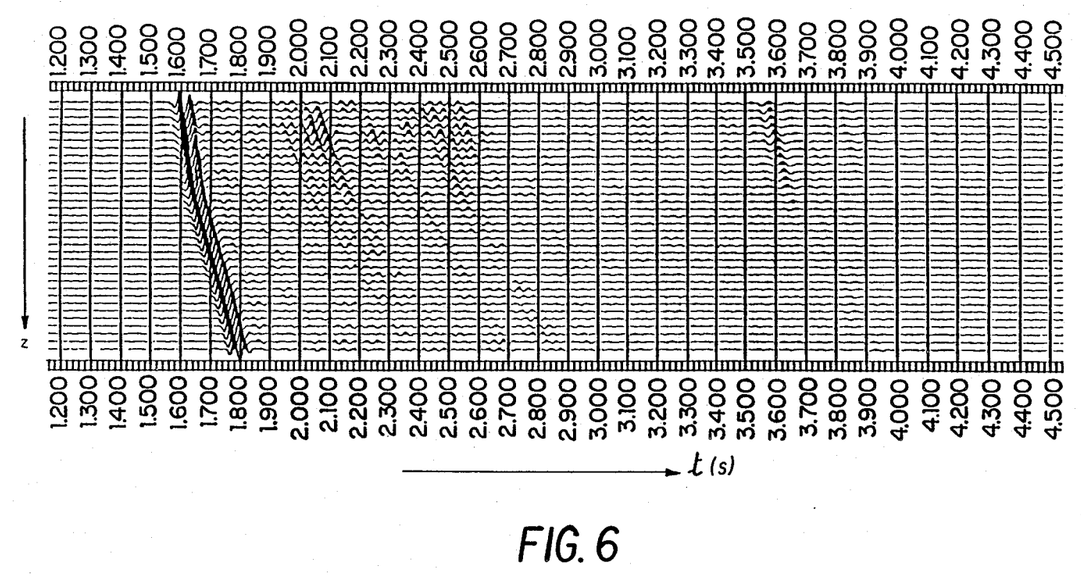
FIGS. 6 to 9 illustrate respectively, a signal recorded by means of an installation in accordance with FIG. 1; and the upgoing wave signal after one, two and three applications of the operator A with I=1.

FIG. 6 shows a two-dimensional signal g(z,t) recorded by means of an installation such as that shown in FIG. 1. The upgoing waves are not apparent in this raw signal.

Figure 7:
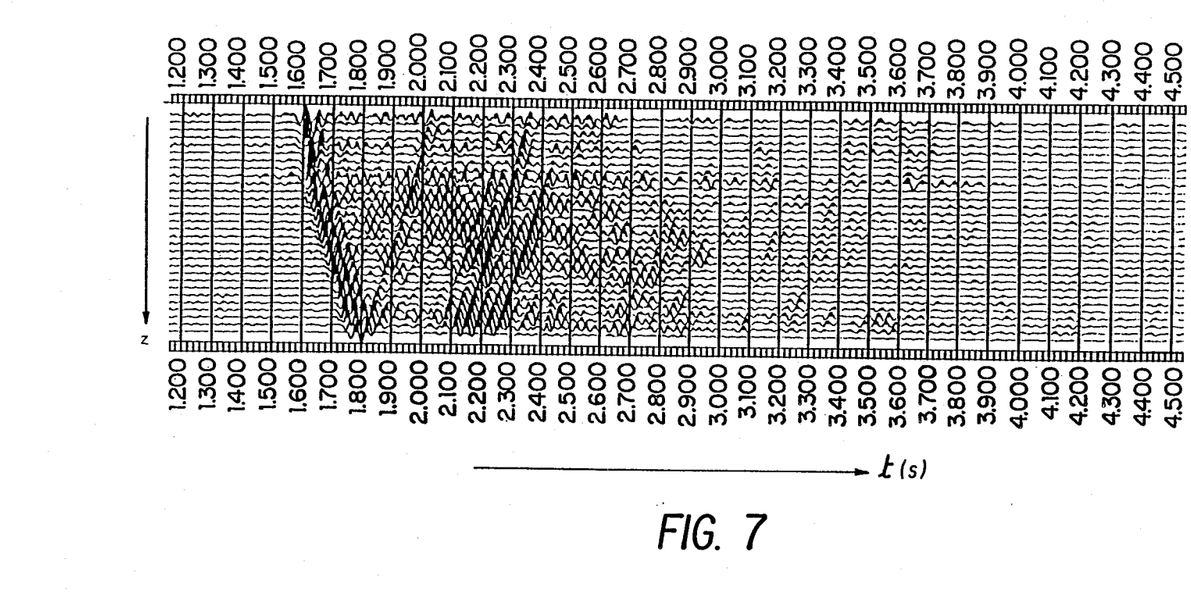

FIG. 7 shows a signal obtained after applying three-level filtering to the FIG. 6 signal with an operator A for which $\epsilon = +1$ and I=1. The upgoing waves show up much more clearly, while the downgoing waves are attenuated.

Figure 8:
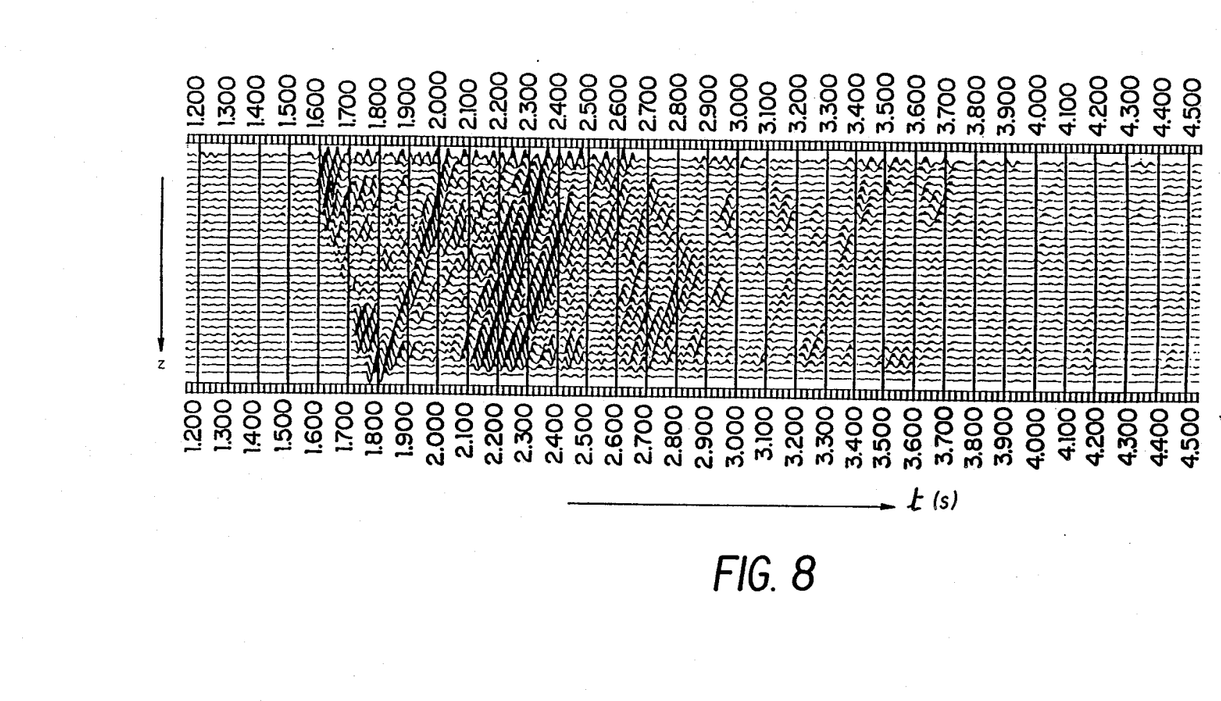
Figure 9:
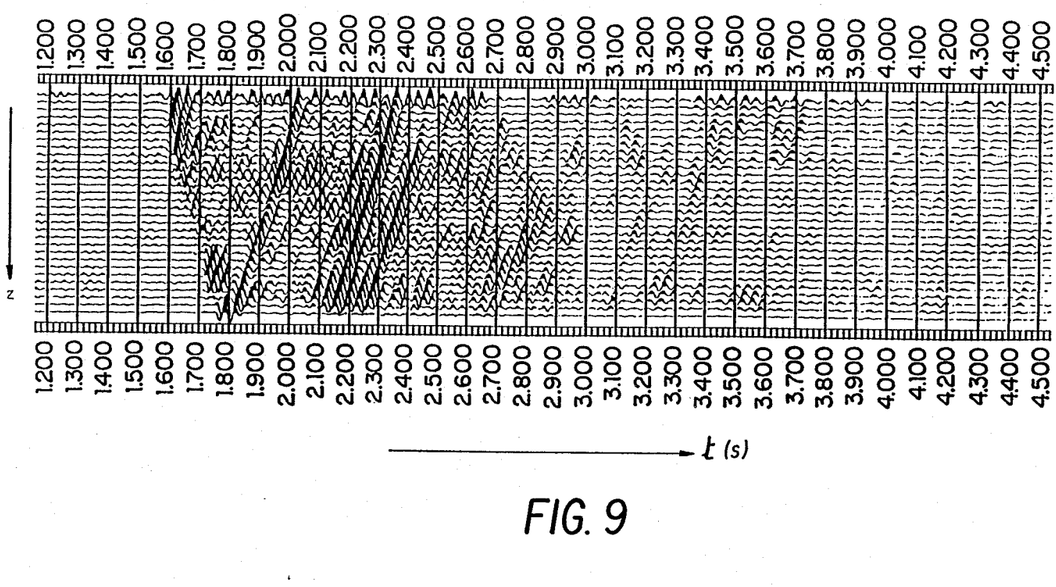

The signal shown in FIG. 8 is the result of reapplying the operator A on the FIG. 7 signal. The upgoing waves are nearly perfect and the residual downgoing waves can hardly be seen. p FIG. 9 shows the result of applying the operator A to the FIG. 8 signal. FIG. 9 is practically identical to FIG. 8 which means that filtering convergence has already been obtained in FIG. 8.

Figure 10:
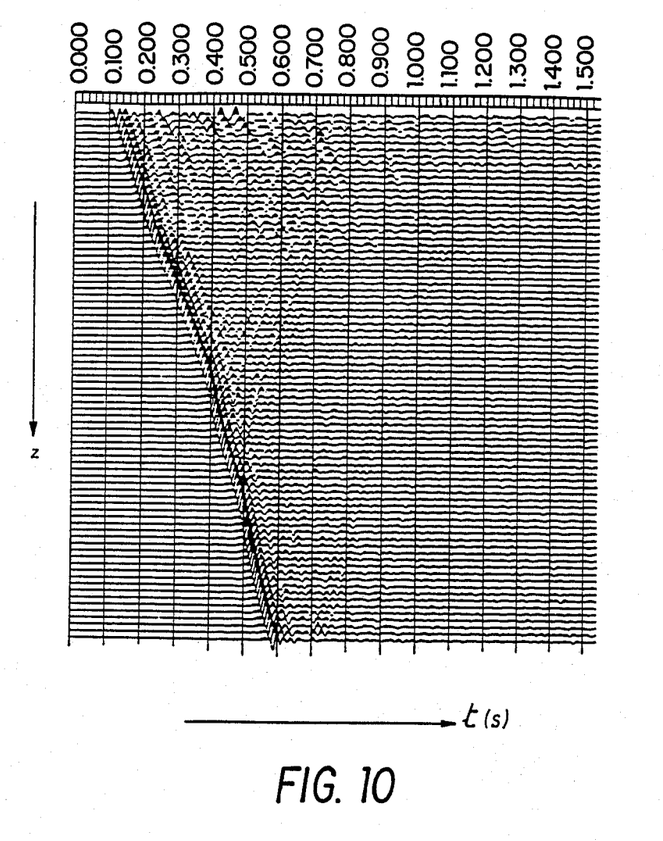
FIGS. 10 to 12, respectively, show the signal recorded by means of an installation in accordance with FIG. 1, and an upgoing wave signal and a downgoing wave signal obtained in accordance with the present invention.
Figure 11:
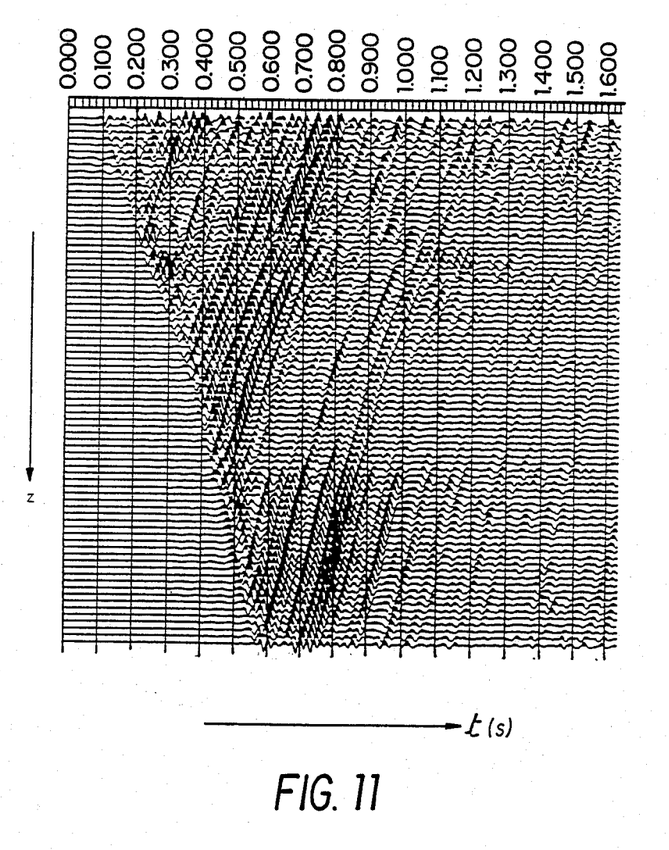
Figure 12:
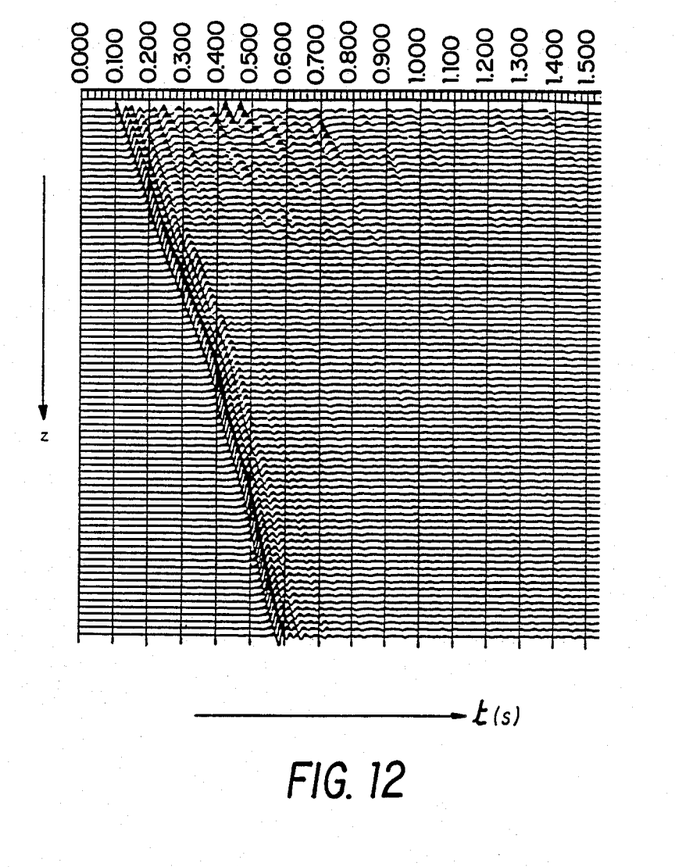

FIG. 10 shows another signal recorded by means of an installation such as that shown in FIG. 1. This signal has been filtered in accordance with the invention using an operator A for which $\epsilon = +1$ and I=1, and with an operator A in which $\epsilon = -1$ and I=1. The corresponding upgoing and downgoing signals are shown respectively in FIGS. 11 and 12.

Figure 13:
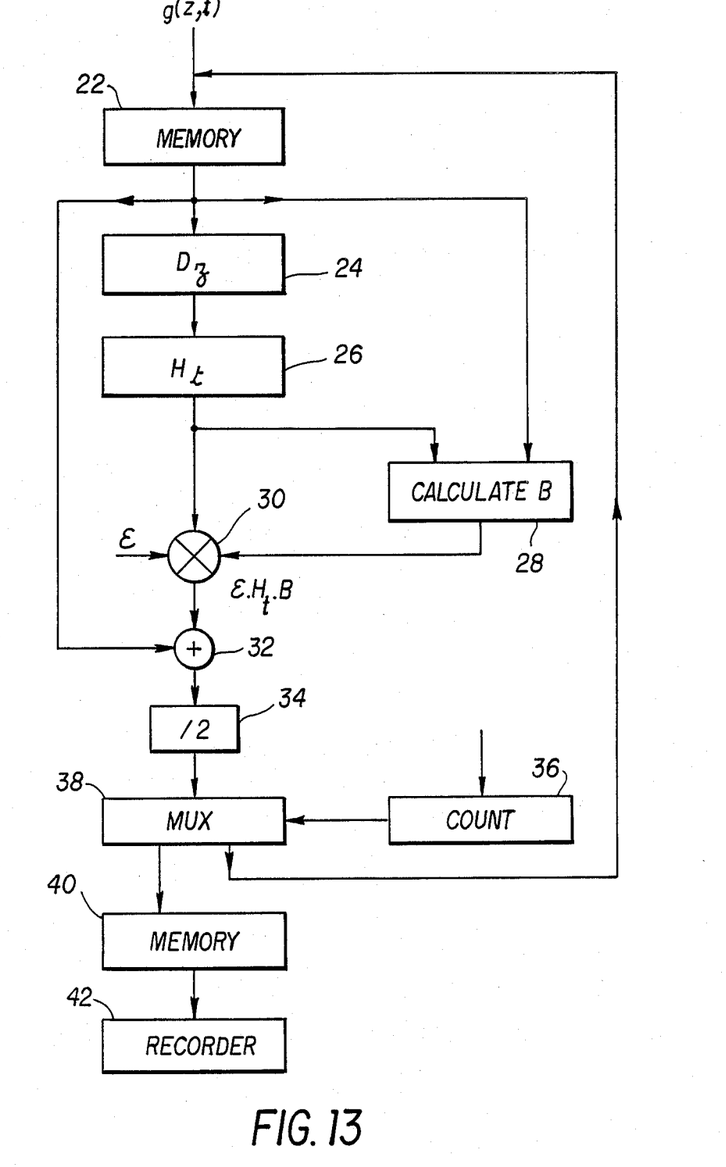
FIG. 13 is a flow chart of processing means in an installation for implementing the method in accordance with the invention.

FIG. 13 is a flow chart applicable to an installation in accordance with the present invention for filtering a two-dimensional signal g(z,t).

This installation comprises memory 22 for receiving the detection signals $g_i(t)$, for $1 < i < n$ constituting the two-dimensional signal g(z,t). This memory is controlled to provide the necessary signals $g_i(t)$ to calculating means 24 in order to produce the result of applying the operator $D_z$ to the signal g(z,t). E.g., when the operator $D_z$ is defined by $D_z[h(z)] = h(z-1) - h(z+1)$ for some function h, the memory is controlled to provide calculating means 24 with pairs of values (gi(t), gi+2(t)) for $1 < i < n - 2$.

The signal $D_z[g(z,t)]$ delivered by calculating means 24 is received by calculating means 26 which produces the Hilbert transform relative to the variable t. This Hilbert transform may be performed in any known manner, and in particular, as mentioned above, it may be performed using the Fourier transform in the following equation:

$$H_t(g) = IFT_t[j.sgn(\omega).FT_t(g)]$$

The signal $H_t.D_z.[g(z,t)]$ delivered by calculating means 26 is applied to one of the inputs of calculating means 28; the signal contained in memory 22 is applied to the other input of calculating means 28. Calculating means 28 calculates the value of the coefficient B which appears in the operator A of methods in accordance with the present invention to make the operator A conserve the amplitude of the signal applied thereto.

The coefficient B delivered by calculating means 28 is multiplied by the signal delivered by calculating means 26 in multiplier 30. Multiplier 30 also receives the coefficient $\epsilon$ whose value is fixed by the user: $\epsilon = +1$ if the upgoing waves in the signal $g(z,t)$ are to be retained, or $\epsilon = -1$ if the downgoing waves are to be retained.

The signal $\epsilon.B.H_t.D_z.[g(z,t)]$ delivered by multiplier 30 is received on one of the inputs to adder 32 whose other input receives the signal contained in memory 22. The resulting signal is then applied to one of the inputs of divide-by-two circuit 34.

Means 24 to 34 constitute a particular embodiment for implementing the operator A. In accordance with the present invention, this operator is applied recursively. The number of times I that this operator is applied to the two-dimensional signal may be loaded, for example, into counter 36 which controls multiplexer 38.

The input of the multiplexer is connected to the output from divider 34; one of the multiplexer's outputs is connected to memory 40, the other is connected to memory 22. The counter is initially loaded with the value 1 and is decremented each time the operator A is applied. So long as the contents of the counter is not zero, the output of divider 34 is connected to memory 22. When the counter reaches the value 0, the output of divider 34 is connected to memory 40.

Recorder 42 is connected to memory 40 in order to produce a graphical recording of the processed two-dimensional signal as shown in FIGS. 7, 8, 9, 11 and 12.

FIGS. 7, 8, 9 and 11 show signals which contains only upgoing wave components. In these signals, all of the upgoing waves are present regardless of their velocities. Similarly, the signal shown in FIG. 12 includes all of the downgoing wave components, regardless of their velocities.

It is possible to perform filtering over a fan so as to retain only those waves whose velocities lie in a predetermined velocity band. Such filtering serves to eliminate noise components and components which are not applicable to the intended analysis to be performed on the detected signal $g(z,t)$.

Figure 14:
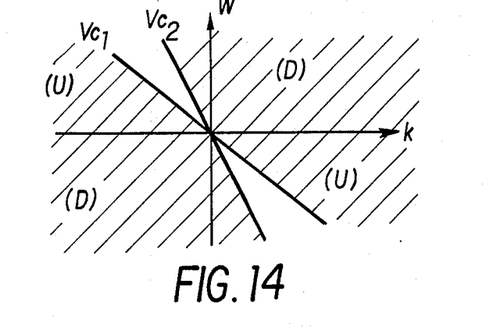
FIG. 14 is a plot of the w-k transform showing the zone containing all of the waves whose velocities lie between the velocities $Vc_1$ and $Vc_2$.

For example, instead of conserving all of the upgoing waves, i.e. all of quadrants II and IV in the FIG. 3 plot, it may be desirable to conserve only those waves whose velocities lie in the band [$Vc_1$, $Vc_2$], i.e. in the unshaded portion of the plot shown in FIG. 14.

Such fan filtering is preferably obtained in three stages by using the method of separating upgoing and downgoing components in accordance with the present invention. The first stage consists of processing the signal $g(z,t)$ to produce a first signal $g_1(z,t)$ from which all waves having a velocity of less than Vc1 have been eliminated.

Similarly, the second stage consists of processing the signal $g(z,t)$ in order to produce a second signal $g_2(z,t)$ from which all waves having a velocity less than $Vc_2$ have been eliminated.

Finally, the third stage consists in subtracting the signal $g_2(z,t)$ from the signal $g_1(z,t)$ in order to produce a signal $g_{12}(z,t)$ which contains only those waves whose velocities lie between $Vc_1$ and $Vc_2$.

Figure 15A:
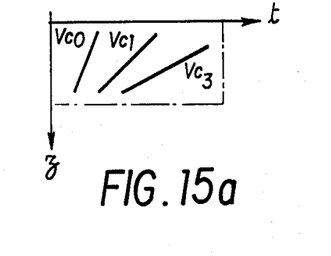
FIGS. 15a to 15e are plots showing the filtering of a detected signal g(z,t) for eliminating waves having a velocity less than $Vc_1$ from this signal.

The first stage of such range filtering is described with reference to FIGS. 15a to 15e. In FIG. 15a, three upgoing waves having different velocities $Vc_0$, $Vc_1$, and $Vc_3$ such that $Vc_0 > Vc_1 > Vc_3$ are shown diagrammatically.

Figure 15B:
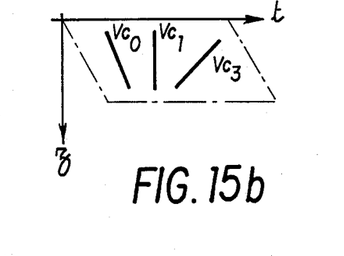
Figure 15C:
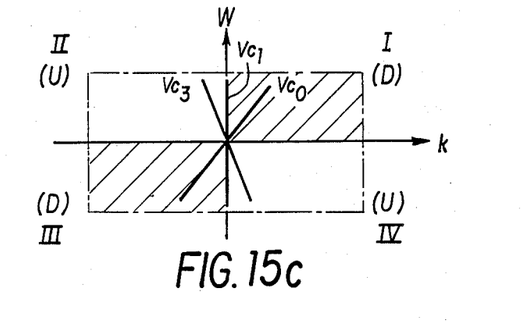
Figure 15D:
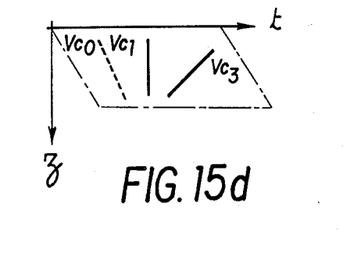

To begin with, the signals $g_i(t)$ for $2 < i < n$ constituting the two-dimensional signal $g(z,t)$ are time shifted such that in each signal $g_i(t)$ for $1 < i < n$ the components of waves at velocity $Vc_1$ are aligned. As a result the upgoing wave of velocity $Vc_0$ becomes a downgoing wave, as shown in FIG. 15b. Such shifting is described, for example, in above-mentioned French patent document FR-A-2 494 450, although for use in a different application.

The velocity filtering method in accordance with the present invention is then applied in order to show up the upgoing wave components in the shifted signal. In the transform domain plot shown in FIG. 15c, this gives rise to a high degree of attenuation for the waves contained in quadrants I and III. In the time domain plot of FIG. 15d, waves of velocities less than $Vc_1$ are emphasized whereas waves of velocities greater than $Vc_1$ are highly attenuated.

Figure 15E:
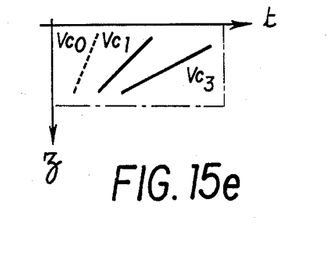

The first stage terminates by shifting the signals $g_i(t)$ for $2 < i < n$ back again in order to cancel the time shift performed initially. This gives rise to the signal $g_i(z,t)$ which is shown in the FIG. 15e plot.

The second stage is identical to the first stage except that the signals $g_i(t)$ for $2 < i < n$ are time shifted so that wave components of velocity $Vc_2$ are aligned in the signals $g_i(t)$ for $1 < i < n$.

The time shifts performed at the beginning of the first and second stages are delays when the velocities $Vc_1$ and $Vc_2$ are positive (upgoing waves); the shifts would be advances if the velocities were negative (downgoing waves).

A signal $g_{12}(z,t)$ which predominantely contains waves whose velocities lie in the band [Vc1, Vc2] is obtained merely by taking the difference between the signal $g_1(z,t)$ produced in the first stage and the signal $g_2(z,t)$ produced in the second stage.

Although illustrative embodiments of the present invention have been described in detail with reference to the accompanying drawings, it is to be understood that the invention is not limited to those precise embodiments. Various changes or modifications may be effected therein by one skilled in the art without departing from the scope or spirit of the invention.

What I claim as my invention is:

1. A method of seismic exploration by filtering a two-dimensional signal $g(z,t)$ built up from a set of signals $g_i(t)$ for $1 < i < n$ as produced by at least one seismic wave detector placed at different depths $z_1, \ldots, z_i, \ldots, z_n$ in a borehole, each of said signals being produced in response to seismic waves, said signals including upgoing wave components and downgoing wave components, said filtering method comprising the steps of:

consisting in separating said ongoing and downgoing wave components by applying an operator A wherein:

$$A = \tfrac{1}{2}[Id + \epsilon.B.H_t.D_z]$$

in which:

Id is the identity operator;

B is a normalization factor whose value depends on the signal to which the operator A is applied;

$H_t$ is the one-dimensional Hilbert operator with respect to the variable t;

D is a differentiation operator with respect to the variable z; and $\epsilon$ is an integer equal to $+1$ or $-1$; and applying said operator recursively to said two-dimensional signal g(z,t), wherein the resulting signal predominantly constitutes upgoing waves when $e=+1$ and downgoing waves when $\epsilon=-1$.

2. A method according to claim 1, wherein the operator $D_z$ is defined by:

$$D_z[g(z)] = \sum_{m=1}^{I} \frac{g(z + 2m - 1) - g(z - 2m + 1)}{2m - 1}$$

where g is some function and I is an integer.

3. The method according to claim 2, wherein I is equal to 1.

4. The method according to claim 2, wherein I is equal to 2.

5. The method according to claim 2, wherein said operator $H_t$ is defined by:

$$H_t(g(t)) = FT^{-1}[j.sgn(\omega).FT(g(t))]$$

where:

g is some function;

FT represents the Fourier transform;

IFT represents the inverse Fourier transform;

sgn($\omega$) designated the sign of the variable $\omega$, which is the dual of t; and j is the complex operator such that $j^2 = -1$.

6. The method according to claim 5, wherein said operator A is applied once only to the signal g(z,t).

7. The method of claim 5 further including the steps of fan filtering to reinforce waves in the signal g(z,t) having velocities lying between predetermined velocities $Vc_1$ and $Vc_2$, said fan filtering method comprising the steps of:

(A)
(a) producing a first shifted two-dimensional signal by applying a time shift to the signal $g_i(t)$ for $2 < i < n$ in order to time align the wave components of velocity $Vc_1$ in the signals $g_i(t)$ for $1 < i < n$;

(b) producing a first two-dimensional signal $g_1(z,t)$ by time shifting the signals $g_i(t)$ for $2 < i < n$ to cancel said time shift;

(B)
(a) producing a second shifted two-dimensional signal by performing a time shift on the signals $g_i(t)$ for $2 < i < n$ in order to time align the wave components of velocity $Vc_2$ in the signals $g_i(t)$ for $1 < i < n$;

(b) producing a second two-dimensional signal $g_2(z,t)$ by time shifting the signals $g_i(t)$ for $2 < i < n$ to cancel the preceding time shift; and (C) taking the difference between the signals $g_1(z,t)$ and $g_2(z,t)$ to produce a signal $g_{12}(z,t)$ which is predominately constituted by waves having velocities lying between $Vc_1$ and $Vc_2$.

8. A seismic signal velocity filter for use in a seismic exploration installation, said installation including at least one sound wave detector, means for displacing said detector along a borehole, means for recording a two-dimensional signal g(z,t) constituted by the signals $g_i(t)$ for $1 < i < n$ produced by the detector, said signals including upgoing wave components and downgoing wave components, said signal velocity filter comprising:

first memory to receive the two-dimensional signal g(z,t);

first calculating means for applying a discrete differentiation operator $D_z$ with respect to the variable z in the signal contained in memory;

second calculating means for applying a Hilbert operator $H_t$ with respect to the variable t to the signal of said first calculating means;

third calculating means for determining the value of the coefficient B as a function of the signals in said memory and said second calculating means;

multiplier to multiply the coefficients $\epsilon$, B and the signal of said second calculating means;

adder to add the signal of said first memory and the output signal of said multiplier;

a divide-by-two circuit to receive the signal output from said adder;

a multiplexer having a first input connected to the output from said divide-by-two circuit and a second input connected to the output of a counter, and having a first output connected to a second memory and a second output connected to said first calculating means;

said counter to control the number of times the operator A is applied to the signal g(z,t); and recording means connected to said second memory.

9. The filter of claim 8, wherein said first calculating means implements the operator $D_z$ defined by:

$$D_z[g(z)] = \sum_{m=1}^{I} \frac{g(z + 2m - 1) - g(z - 2m + 1)}{2m - 1}$$

where g is some function and I is an integer.

10. The filter of claim 9, wherein I is equal to 1.

11. The filter of claim 9, wherein I is equal to 2.

12. The filter of claim 8, wherein said second calculating means implements the operator $H_t$ defined by:

$$H_t(g(t)) = FT^{-1}[j.sgn(\omega).FT(g(t))]$$

where:

g is some function;

FT represents the Fourier transform;

IFT represents the inverse Fourier transform;

sgn($\omega$) designates the sign of the variable $\omega$ which is the dual of t; and j is the complex operator such that $j^2 = -1$.

13. The filter of claim 8, wherein said counter controls said multiplexer so that the operator A is applied only once to the signal g(z,t).

14. The filter of claim 8 further including:

means for time shifting the signals $g_i(t)$ for $2 < i < n$ constituting the signal g(z,t) stored in said first and second memories, and means for subtracting the signals $g_1(z,t)$ and $g_2(z,t)$ from each other.

* * * * *